United States Patent [19]

Burrows et al.

[11] Patent Number: 4,725,970

[45] Date of Patent: Feb. 16, 1988

[54] SIMULATION DEVICE

[75] Inventors: James L. Burrows, Merrimack, N.H.; Paul D. Zemany, Setauket, N.Y.

[73] Assignee: Sanders Associates, Inc., Nashua, N.H.

[21] Appl. No.: 698,474

[22] Filed: Feb. 5, 1985

[51] Int. Cl.$^4$ ............................ G06F 9/30; G06F 7/00
[52] U.S. Cl. ..................................... 364/578; 364/200
[58] Field of Search ................ 364/200, 300, 900, 578

[56] References Cited

U.S. PATENT DOCUMENTS

| | | | |
|---|---|---|---|
| 4,084,235 | 4/1978 | Hirtle et al. ........................... | 364/200 |
| 4,342,093 | 7/1982 | Miyoshi ................................. | 364/578 |
| 4,484,266 | 11/1984 | Becker et al. ......................... | 364/200 |
| 4,494,191 | 1/1985 | Itoh ....................................... | 364/200 |
| 4,513,374 | 4/1985 | Hooks, Jr. ............................. | 364/200 |
| 4,527,249 | 7/1985 | Van Brunt ............................ | 364/578 |
| 4,583,169 | 4/1986 | Cooledge ............................. | 364/300 |

OTHER PUBLICATIONS

"Type SN74LS362 (TIM9904) Four-Phase Clock Generator/Driver", *The TTL Data Book for Design Engineers*, 2nd ed. (Texas Instruments, 1976), pp. 7–460 through 7–466.
"Type SN74LS362 (TIM9904) Four-Phase Clock Generator/Driver", *The Bipolar Microcomputer Components Data Book for Design Engineers*, 2nd ed. (Texas Instruments, 1979), pp. 6–27 through 6–33.
"Am2925 Clock Generator and Microcycle Length Controller", *Advanced Micro Devices Bipolar Microprocessor Logic and Interface Data Book* (Advanced Micro Devices, Sunnyvale, 1985), pp. 5–220 through 5–235.
"AM2925 Clock Generator and Microcycle Length Controller", *Advanced Micro Devices Bipolar Microprocessor Logic and Interface Data Book* (Advanced Micro Devices, Sunnyvale, 1983), pp. 5–238 through 5–251.
"Am2925 System Clock Generator and Driver: Advanced Information", *Advanced Micro Devices the Am2900 Family Data Book with Related Support Circuits* (Advanced Micro Devices, Sunnyvale, 1978), pp. 2–183.

*Primary Examiner*—Felix D. Gruber
*Attorney, Agent, or Firm*—Richard I. Seligman; Stanton D. Weinstein

[57] ABSTRACT

A simulator for simulating the response of a network of predefined processing elements to a set of input stimuli. The network processing elements are arrayed in a plurality of rows and columns and a representation of each element is stored in a storage location in a symbol memory, the storage locations of which have row and column addresses corresponding to the rows and columns in the network array. A control circuit iteratively receives representations from the symbol memory identifying a processing element at a location in the network and controls an arithmetic and logic unit to generate an output signal representative of the output of the corresponding processing element in response to input stimuli which are represented by data signals from a data memory and an intermediate storage register. The control circuit then controls the storage of the output signal from the arithmetic and logic unit in the data memory and the intermediate storage register. The simulator iteratively processes each processing element by stepping across each row in the network and down from one row to the next until all of the elements are processed.

12 Claims, 10 Drawing Figures

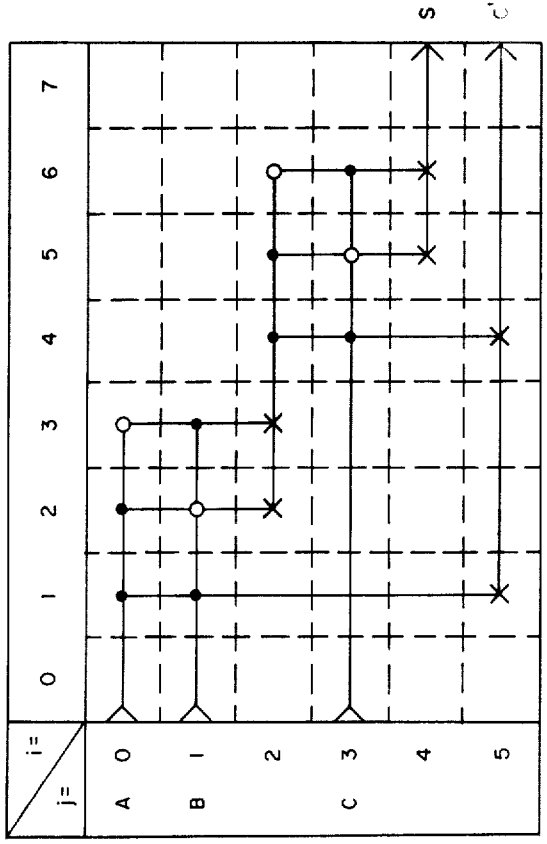

FIG. 4C
SYMBOL MEMORY MAP

| j= \ i= | 0 | 1 | 2 | 3 | 4 | 5 | 6 | 7 | |
|---|---|---|---|---|---|---|---|---|---|
| A  0 | X | A | A | C | Z | Z | Z | Z | |
| B  1 | X | B | D | B | Z | Z | Z | Z | |
| 2 | Z | V | E | F | A | A | C | Z | |
| C  3 | X | K | H | H | B | D | B | Z | |
| 4 | Z | V | Z | Z | V | E | F | Y | S |
| 5 | Z | E | H | H | F | H | H | Y | C' |

FIG. 4D
DATA MEMORY MAP

| j= \ i= | 0 | 1 | 2 | 3 | 4 | 5 | 6 | 7 | |
|---|---|---|---|---|---|---|---|---|---|
| A=1  0 | 1 | – | – | – | – | – | – | – | |
| B=0  1 | 0 | (1) | (1) | (0) | – | – | – | – | |
| 2 | – | (0) | (0) | (0) | – | – | – | – | |
| C=1  3 | 1 | (0) | – | – | (0) | (0) | (1) | – | |
| 4 |   | (0) | – | – | (0) | (1) | (1) | – | S=1 |
| 5 |   | (0) | – | – | (0) | – | – | – | C'=0 |

FIG. 4E-1

| STEP | CLK A ADDRESS | | CLK B | | CLK C | | | | | | CLK D | | | |
|---|---|---|---|---|---|---|---|---|---|---|---|---|---|---|
| | | | SYN MEM OUT | DATA MEM OUT | CONTROL CIRCUIT | | | | ALU OUT | DM IN LOC | | DM IN DATA | LIN REG |
| | COL | ROW | | | R(4) | R(3) | R(2:0) | DM CTRL | | | COL | ROW | | |
| 0 | 0 | 0 | X | 1 | 0 | 1 | 2 | 0 | 1 | 0 | 1 | – | 1 |
| 1 | 1 | 0 | A | – | 0 | 0 | 0 | 1 | 1 | 1 | 1 | 1 | 1 |
| 2 | 2 | 0 | A | – | 0 | 0 | 0 | 1 | 1 | 2 | 1 | 1 | 1 |
| 3 | 3 | 0 | C | – | 0 | 0 | 1 | 1 | 0 | 3 | 1 | 0 | 1 |
| 4 | 4 | 0 | Z | – | 0 | 0 | 0 | 0 | 1 | 4 | 1 | – | 1 |
| 5 | 5 | 0 | Z | – | 0 | 0 | 0 | 0 | 1 | 5 | 1 | – | 1 |
| 6 | 6 | 0 | Z | – | 0 | 0 | 0 | 0 | 1 | 6 | 1 | – | 1 |
| 7 | 7 | 0 | Z | – | 0 | 0 | 0 | 0 | 1 | 7 | 1 | – | 1 |
| 8 | 0 | 1 | X | 0 | 0 | 1 | 2 | 0 | 0 | 0 | 2 | – | 0 |
| 9 | 1 | 1 | B | 1 | 0 | 0 | 3 | 1 | 0 | 1 | 2 | 0 | 0 |
| 10 | 2 | 1 | D | 1 | 0 | 0 | 4 | 1 | 0 | 2 | 2 | 0 | 0 |
| 11 | 3 | 1 | B | 0 | 0 | 0 | 3 | 1 | 0 | 3 | 2 | 0 | 0 |
| 12 | 4 | 1 | Z | – | 0 | 0 | 0 | 0 | 0 | 4 | 2 | – | 0 |
| 13 | 5 | 1 | Z | – | 0 | 0 | 0 | 0 | 0 | 5 | 2 | – | 0 |
| 14 | 6 | 1 | Z | – | 0 | 0 | 0 | 0 | 0 | 6 | 2 | – | 0 |
| 15 | 7 | 1 | Z | – | 0 | 0 | 0 | 0 | 0 | 7 | 2 | – | 0 |
| 16 | 0 | 2 | Z | – | 0 | 0 | 0 | 0 | 0 | 0 | 3 | – | 0 |
| 17 | 1 | 2 | V | 0 | 0 | 0 | 2 | 1 | 0 | 1 | 3 | 0 | 0 |
| 18 | 2 | 2 | E | 0 | 0 | 1 | 2 | 0 | 0 | 2 | 2 | – | 0 |

FIG. 4E-2

| STEP | CLK A ADDRESS | | CLK B | | CLK C | | | | | CLK D | | | |
|---|---|---|---|---|---|---|---|---|---|---|---|---|---|
| | | | SYN MEM OUT | DATA MEM OUT | CONTROL CIRCUIT | | | | ALU OUT | DM IN LOC | | DM IN DATA | LIN REG |
| | COL | ROW | | | R(4) | R(3) | R(2:0) | DMCTRL | | COL | ROW | | |
| 19 | 3 | 2 | F | 0 | 0 | 0 | 5 | 0 | 0 | 3 | 3 | – | 0 |
| 20 | 4 | 2 | A | – | 0 | 0 | 0 | 1 | 0 | 4 | 3 | 0 | 0 |
| 21 | 5 | 2 | A | – | 0 | 0 | 0 | 1 | 0 | 5 | 3 | 0 | 0 |
| 22 | 6 | 2 | C | – | 0 | 0 | 1 | 1 | 1 | 6 | 3 | 1 | 0 |
| 23 | 7 | 2 | Z | – | 0 | 0 | 0 | 0 | 0 | 7 | 3 | – | 0 |
| 24 | 0 | 3 | X | 1 | 0 | 1 | 2 | 0 | 1 | 0 | 4 | – | 1 |
| 25 | 1 | 3 | K | 0 | 0 | 0 | 2 | 1 | 0 | 1 | 4 | 0 | 1 |
| 26 | 2 | 3 | H | – | 0 | 0 | 0 | 0 | 1 | 2 | 4 | – | 1 |
| 27 | 3 | 3 | H | – | 0 | 0 | 0 | 0 | 1 | 3 | 4 | 0 | 1 |
| 28 | 4 | 3 | B | 0 | 0 | 0 | 3 | 1 | 0 | 4 | 4 | 0 | 1 |
| 29 | 5 | 3 | D | 0 | 0 | 0 | 4 | 1 | 1 | 5 | 4 | 1 | 1 |
| 30 | 6 | 3 | B | 1 | 0 | 0 | 3 | 1 | 1 | 6 | 4 | 1 | 1 |
| 31 | 7 | 3 | Z | – | 0 | 0 | 0 | 0 | 1 | 7 | 4 | – | 1 |
| 32 | 0 | 4 | Z | – | 0 | 0 | 0 | 0 | 1 | 0 | 5 | – | 1 |
| 33 | 1 | 4 | V | 0 | 0 | 0 | 2 | 1 | 0 | 1 | 5 | 0 | 1 |
| 34 | 2 | 4 | Z | – | 0 | 0 | 0 | 0 | 1 | 2 | 5 | – | 1 |
| 35 | 3 | 4 | Z | – | 0 | 0 | 0 | 0 | 1 | 3 | 5 | – | 1 |
| 36 | 4 | 4 | V | 0 | 0 | 0 | 2 | 1 | 0 | 4 | 5 | 0 | 1 |
| 37 | 5 | 4 | E | 1 | 0 | 1 | 2 | 0 | 1 | 5 | 5 | – | 1 |

FIG. 4E-3

| STEP | CLK A ADDRESS | | CLK B | | CLK C | | | | | CLK D | | | |
|---|---|---|---|---|---|---|---|---|---|---|---|---|---|
| | | | SYN MEM OUT | DATA MEM OUT | CONTROL CIRCUIT | | | | ALU OUT | DM IN LOC | | DM IN DATA | LIN REG |
| | COL | ROW | | | R(4) | R(3) | R(2:0) | DMCTRL | | COL | ROW | | |
| 38 | 6 | 4 | F | 1 | 0 | 0 | 5 | 0 | 1 | 6 | 5 | - | 1 |
| 39 | 7 | 4 | Y | - | 1 | 0 | 0 | 0 | 1 | 7 | 5 | - | 1 |
| 40 | 0 | 5 | Z | - | 0 | 0 | 0 | 0 | 1 | 0 | 6 | - | 1 |
| 41 | 1 | 5 | E | 0 | 0 | 1 | 2 | 0 | 0 | 1 | 6 | - | 0 |
| 42 | 2 | 5 | H | - | 0 | 0 | 0 | 0 | 0 | 2 | 6 | - | 0 |
| 43 | 3 | 5 | H | - | 0 | 0 | 0 | 0 | 0 | 3 | 6 | - | 0 |
| 44 | 4 | 5 | F | 0 | 0 | 0 | 5 | 0 | 0 | 4 | 6 | - | 0 |
| 45 | 5 | 5 | H | - | 0 | 0 | 0 | 0 | 0 | 5 | 6 | - | 0 |
| 46 | 6 | 5 | H | - | 0 | 0 | 0 | 0 | 0 | 6 | 6 | - | 0 |
| 47 | 7 | 5 | Y | - | 1 | 0 | 0 | 0 | 0 | 7 | 6 | - | 0 |

SIMULATION DEVICE

BACKGROUND OF THE INVENTION

1. Field of the Invention

The invention provides an apparatus for simulating systems that are configured in the form of networks of arrayed processing elements. For example, such apparatus may be used to verify the design of a digital logic network comprising a plurality of digital logic circuits by determining the output signals that would be developed by the network in response to the digital input signals. Other types of networks, including pipe, electric power and telephone networks, road networks and floor plans, for example, may also be simulated using apparatus constructed in accordance with this invention. Furthermore, the invention also finds utility in such fields as image processing and image analysis, in which an image can be divided into an array of picture elements, or "pixels", and the pixels analyzed in relation to their neighbors.

2. Description of the Prior Art

In the past, the logical operation of electronic networks has been verified by constructing a prototype of the network on a "breadboard", and connecting appropriate test equipment. Input signals are then applied to the inputs of the network, the output signal generated by the network is sensed, and the actual output signals are compared to the desired output signal to determine if they are identical. The process of applying the input signals and sensing the output signals must be repeated for every possible set of input signals to completely verify the circuit design. For some circuitry, for example a three-to-eight digital decoder, in which one of eight output lines is energized in response to a selected encoding of the three input lines, only eight different sets of three input signals are required to test the circuit. However, for an adder which generates sum and carry signals in response to two sixteen-bit input words, in excess of one hundred thousand possible combinations of the input signals are possible. It is apparent that verification of a breadboard prototype of such a circuit by this method would be an extremely lengthy process, if it were desired to test the circuit with all possible combinations of input signals.

The process of verifying the design of other networks can also be a lengthy task. Piping, wiring networks for electrical power and telephones, roadways and floor plans normally cannot be breadboarded, and therefore the design must be verified from the plans and testing in the field. This can be expensive if a design error must be corrected.

Furthermore, image processing and analysis, including enhancement of faint images and recognition of various shapes, can be a lengthy process if done manually. A number of computer algorithms have been written to attempt to automate the process of image recognition, but to date these have been fairly slow.

SUMMARY OF THE INVENTION

The invention aims to provide a new and improved apparatus for simulating the operation of a network in response to input signals selected by an operator. More specifically, the invention provides an apparatus which enables the designer of, for example, a digital electronic circuit network, to simulate the operation of the network in response to a set of input signals and to verify that the circuit performs the required logic operations.

The invention is also useful in other areas which require modeling of a design which can be expressed in the form of an array such as a lattice tree or a network of processing elements. For example, the invention can be used to model traffic flows through a roadway network or to model fluid flow through a piping system. In a roadway, processing elements may comprise stop signs or lights, traffic rotaries, and on- and off-ramps. In a piping system, processing elements may comprise valves, fluid sinks and sources, combustion chambers (for chemical plants) and so forth. Similarly, the invention can be used to model foot traffic patterns through a building floor plan. The invention will be described in terms of a simulator for a digital electronic logic network; however, the use of the invention in other areas will be readily apparent to those skilled in the art.

In brief, the invention provides a simulator that processes a network of elements that may be arranged in an array pattern of rows and columns. The elements which are selected to form the network are of predetermined types having input and output characteristics corresponding to actual logical elements which would be used to construct an electronic circuit.

The new simulator includes a symbol memory and a data memory, both having storage locations having row and column addresses corresponding to the rows and columns of the elements in the network being simulated. Each location in the symbol memory stores a representation identifying the type of processing element which is present at the corresponding location in the network. Prior to beginning the simulation, an operator loads data into locations in the data memory which correspond to the network input terminals. During the simulation, the data memory stores process data generated by the simulator in response to each processing element that is processed. An address computation circuit iteratively generates row and column addresses which identify corresponding locations in the symbol and data memories, beginning from a network input terminal and stepping across the array, row by row. During each iteration, a representation identifying the type of process element at the corresponding location in the network is transmitted by the symbol memory to a control circuit, and process data is transmitted to an arithmetic and logic unit. The control circuit controls the operation of the arithmetic and logic unit and the storage of process data in the data memory during each iteration in response to the type of processing element identified by the representation from the symbol memory.

BRIEF DESCRIPTION OF THE DRAWINGS

The invention is pointed out with particularity in the appended claims. The advantages of the invention may be better understood by referring to the following description taken in conjunction with the accompanying drawings, in which:

FIG. 3 is a table which is useful in understanding the operations of the simulator depicted in FIG. 1; and FIGS. 4A through 4E-3 are diagrams which present an example of the operation of the simulator depicted in FIGS. 1 through 3.

DESCRIPTION OF THE PREFERRED EMBODIMENTS

Figure 1:
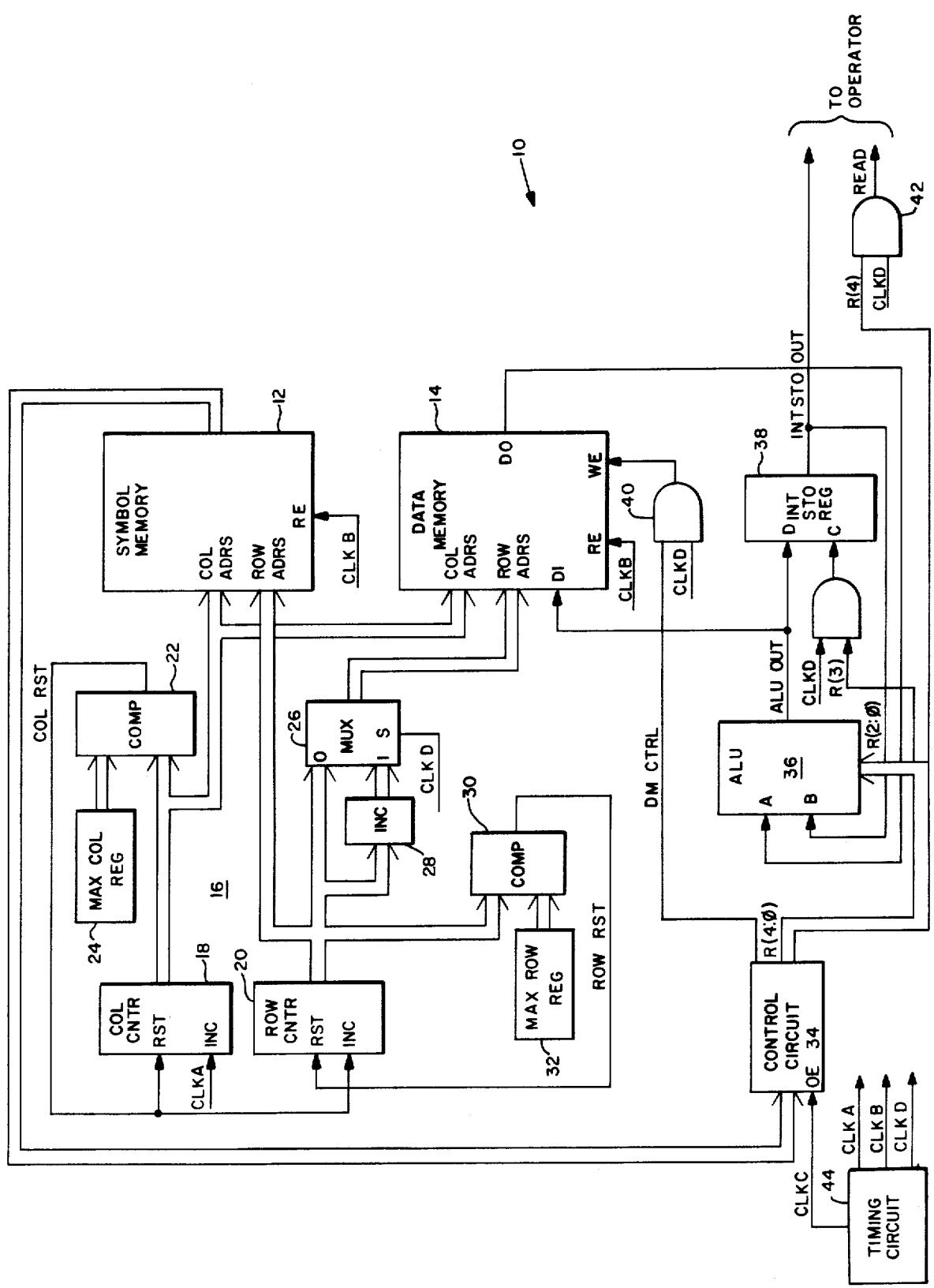
FIG. 1 is a block diagram of a simulator constructed in accordance with the invention.
Figure 2:
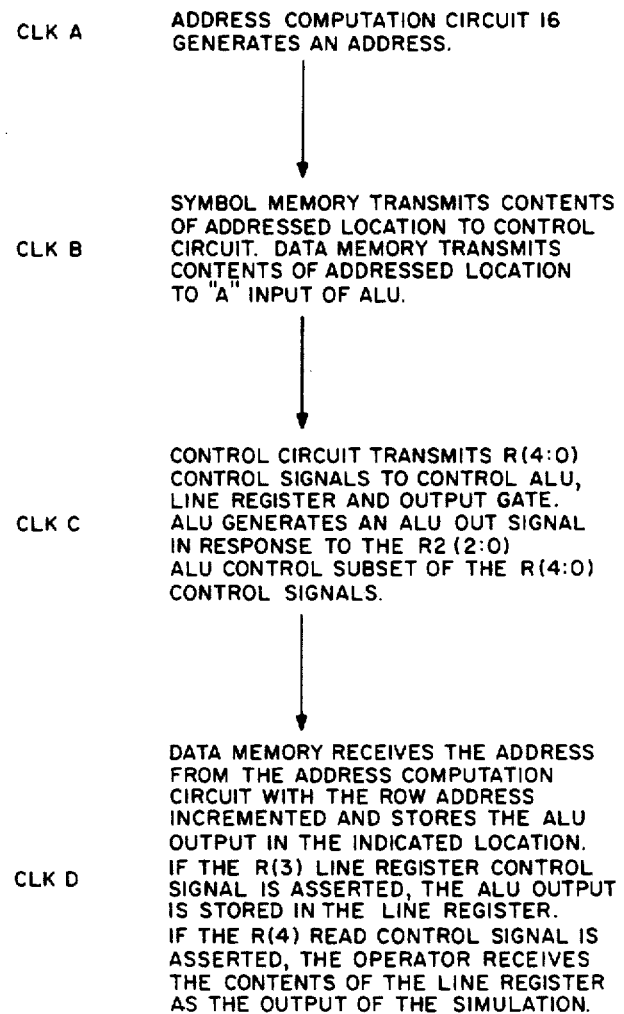
FIG. 2 is a flow diagram which is useful in understanding the operations of the simulator depicted in FIG. 1.

FIG. 1 depicts a general block diagram of a network simulator 10 constructed in accordance with the invention which is useful in simulating the response of the network to a set of input signals, and FIG. 2 identifies the operations performed by the elements of the simulator in response to four successive timing signals, CLK A, CLK B, CLK C and CLK D, generated by a timing circuit 44. The network under simulation is comprised of a plurality of processing elements arranged in an array pattern of rows and columns, with each type processing element being represented by a different symbol. An example of such a network, and of the operations performed by simulator 10, is presented below with FIGS. 4A–4E-3. With reference to FIGS. 1 and 2, the simulator 10 includes a symbol memory 12 comprising a plurality of storage locations having addresses arranged in a pattern of rows and columns corresponding to the row and column pattern of the network under simulation. A data memory 14 also has a plurality of storage locations arranged in a row and column pattern, with each location corresponding to a location in the symbol memory 12 and, hence, to an element in the network being simulated.

The symbol and data memories are addressed by an address computation circuit 16 including a column counter 18 and a row counter 20. The column counter is clocked by a CLK A timing signal which enables the counter to increment. The output of the column counter 18 comprises column address signals which are coupled to a column address input terminal of symbol memory 12 and data memory 14. In addition, the output of column counter 18 is coupled to a comparator 22, which compares the signals to the contents of a register 24. The contents of register 24 identify the maximum number of columns present in the network under simulation. When the column counter 18 has incremented sufficiently that its output corresponds to the contents of register 24, comparator 22 transmits an COL RST column reset signal which enables column counter 18 to reset to zero, and row counter 20 to increment.

The output of row counter 20 is also coupled to the row address input terminal of symbol memory 12 and to one input terminal of a multiplexer 26. The other input of multiplexer 26 is connected to an incrementation circuit 28 which also receives the output of the row counter, and increments that output by one to address the next row. The multiplexer is controlled by a CLK D timing signal. When the CLK D timing signal is not asserted, the multiplexer 26 couples the output of row counter 20 to the row address terminal of data memory 14, and when the CLK D timing signal is asserted, the output of incrementation circuit 28 is coupled to the row address terminal of data memory 14.

The output of row counter 20 is also coupled to a comparator 30 which compares the output to the contents of a register 32. The contents of register 32 identify the maximum number of rows present in the network under simulation. When the output of the row counter 20 corresponds to the contents of the register 32, the comparator 30 generates an output signal which enables the row counter 20 to reset.

In response to a CLK B timing signal, which is coupled to and controls the RE read enable terminals of the symbol and data memories, the symbol memory 12 transmits the contents of the location identified by the column and row counters 18 and 20 to a control circuit 34. The control circuit controls the operations of an arithmetic and logic unit 36, an intermediate storage register 38, the storage of process data in data memory 14, and signals the operator when a network output signal is available to the operator, all in response to the signals from symbol memory 12 identifying the type of processing element that is located at each location in the network. Also in response to the CLK B timing signal, the data memory 14 transmits the contents of the corresponding location to an A terminal of an arithmetic and logic unit (ALU) 36.

In response to the next CLK C timing signal, the control circuit transmits R(4:0) control signals and a DM CTRL data memory control signal. The R(2:0) ALU control signal subset of the R(4:0) control signals select the operation to be performed by the ALU 36 on the signals present at the A and B input terminals. FIG. 3 depicts a table identifying eight logical ALU functions of one specific embodiment of the invention in response to each of the binary encoded R(2:0) control signals.

In response to the R(2:0) control signals, the ALU 36 transmits an ALU OUT output signal which is coupled to the data input terminals of data memory 14 and the intermediate storage register 38. The ALU OUT signal is latched in the intermediate storage register 38 in response to the next CLK D timing signal if the R(3) control signal from control circuit 34 is asserted. The output of the intermediate storage register 38, an INT STO OUT signal, is coupled to the B input terminal of ALU 36.

As has been mentioned, the ALU OUT output signal from ALU 36 is also coupled to the data input terminal of data memory 14. If the control circuit 34 has asserted the DM CTRL data memory control signal, in response to the next CLK D timing signal, an AND gate 40 enables a WE write enable terminal on the data memory 14. In response, the data memory 14 latches the ALU OUT signal in the location identified by the signals at the column and row address terminals. The multiplexer 26, in response to the CLK D timing signal, couples the output of incrementation circuit 28 to the row address terminals of the data memory 14 and so the signals at the row address terminal correspond to the address identified by row counter 20 as incremented by incrementation circuit 28.

If the contents of the location in symbol memory 12 identify an element corresponding to a network output terminal, the control circuit 34 asserts the R(4) control signal. At the CLK D timing signal, an AND gate 42 is energized to transmit a READ signal which enables an operator to receive the INT STO OUT signal from intermediate storage register 38. The INT STO OUT signal at that point corresponds to the output signal of the network from the ouptut terminal at the location identified by the column and row counters 18 and 20.

One example of a device that could be utilized as timing circuit 44 is the Texas Instruments TIM9904 or SN74LS362 Four-Phase Clock Generator/Driver, described in *The TTL Data Book for Design Engineers*, 2nd ed. (Texas Instruments, 1976) at pages 7–460 through 7–466, and in *The Bipolar Microcomputer Components Data Book for Design Engineers*, 2nd ed. (Texas Instruments, 1979) at pages 6–27 through 6–33. A functional block diagram appears at page 7–461 of *The TTL Data Book*, supra, and at page 6–28 of *The Bipolar Microcomputer Components Data Book*, supra. Note the waveforms for $\phi 1$, $\phi 2$, $\phi 3$ and $\phi 4$ appearing at page 7–460 of

*The TTL Data Book,* supra, and at page 6-27 of *The Bipolar Microcomputer Components Data Book,* supra. Alternatively, the Advanced Micro Devices Am2925 Clock Generator and Microcycle Length Controller could be utilized as timing circuit 44, for example using trailing edges of the system clock outputs. The Am2925 device is described in *Advanced Micro Devices Bipolar Microprocessor Logic and Interface Data Book* (Advanced Micro Devices, Sunnyvale, 1985) at pages 5-220 through 5-235; in *Advanced Micro Devices Bipolar Microprocessor Logic and Interface Data Book* (Advanced Micro Devices, Sunnyvale, 1983) at pages 5-238 through 5-251; and in *Advanced Micro Devices The Am2900 Family Data Book With Related Support Circuits* (Advanced Micro Devices, Sunnyvale, 1978) at page 2-183. Any suitable timing apparatus such as is well known in the art could be utilized as timing circuit 44. Alternatively, any four successive timing signals can be utilized as CLK A, CLK B, CLK C and CLK D, respectively.

Before describing a detailed example of the operations performed by simulator 10 in simulating a specific network, it will be advantageous to describe generally the operations performed by the simulator. Since it is apparent that the address computation circuit 16 (FIG. 1) steps only to the right, in each row, and down after processing each row, the network input terminals of the network under simulation must be positioned at the left side in the upper portion, of the network, and the output terminals must be positioned at the right side in the lower portion of the network. The processing elements forming the network are defined to receive input signals from the left and/or above, and transmit output signals to the right and/or down. In each iteration the data memory 14 stores process data corresponding to the downward output signal of each processing element, if there is one, which, in turn, corresponds to the upper input signal for the element in the next row. The intermediate storage register stores process data corresponding to the right output signal of the processing element during each iteration. Since processing proceeds to the right in a simulation, only one storage location is required as the intermediate storage register, as the contents of the register will be used, if at all, immediately in the next iteration.

The operations of simulator 10 in simulating a network will be described in connection with FIGS. 4A through 4E-3. The network simulated in this example is depicted schematically in FIG. 4A, and comprises a two-bit adder having bit input terminals A and B and a carry input terminal C. The sum output terminal of the adder is identified by the letter S, and the carry output terminal is identified by the letter C'. As shown in FIG. 4A, the adder comprises a plurality of processing elements disposed in an array pattern of eight columns numbered i=0 through i=7, and six rows numbered j=0 through j=5. Each processing element has a column and row address within the network.

The network depicted in FIG. 4A is formed from twelve different types of processing elements which are depicted in FIG. 4B. Each type of processing element is identified by a letter representation "Z", "A", etc. FIG. 4B also depicts the signals generated by control circuit 34 in response to the receipt of the representation of the element from symbol memory 12. The processing elements used in the network schematic diagram of FIG. 4A are represented by a schematic symbol that is used in depicting circuit elements in conventional VLSI layouts and have the following characteristics:

The processing element having the letter representation "Z" indicates that there is no circuit element at that location in the network.

The processing element having the letter representation "A" receives an input signal from the left, and transmits output signals to the right and down. Both output signals have the same value as the input signal.

The processing element having the letter representation "B" receives inputs from the left and above, and transmits output signals to the right and down. The output signal to the right has the same value as the input signal from the left. The output signal down is the logical AND of the input signals.

The processing element having the letter representation "C" receives an input signal from the left and transmits output signals to the right and down. The output signal to the right has the same value as the input signal from the left. The output signal down is the complement of the input signal.

The processing element having the letter representation "D" receives input signals from the left and above, and transmits output signals to the right and down. The output signal to the right has the same value as the input signal from the left. The output signal down has the value of the logical AND of the input signal from the left and the complement of the input signal from above.

The processing element having the letter representation "E" has receives an input signal from above and transmits an output signal to the right. The output signal has the same value as the input signal.

The processing element having the letter representation "F" receives input signals from the left and above, and transmits a single output signal to the right. The output signal corresponds to the logical OR of the input signals.

The processing element having the letter representation "X" is a network input terminal. An operator loads an input value into the data memory at the location corresponding to this processing element. The output signal, which is transmitted to the right, corresponds to the data from the data memory.

The processing element having the letter representation "Y" is a network output terminal. When the control circuit 34 receives the representation of a Y symbol, it transmits the R(4) read signal which enables the operator to receive the INT STO OUT signal from intermediate storage register 38 (FIG. 1). The INT STO OUT signal at this point corresponds to the network output signal at the output terminal.

The processing element having the letter representation "H" (which is a horizontal line) couples the input signal from the left as the output signal transmitted to the right.

The processing element having the letter representation "V" (which is a vertical line) couples the input signal from above as the output signal transmitted downwardly.

The processing element having the letter representation "K" (which represents crossed lines) couples the input signal from the left to the right, and the input signal from above as the output signal transmitted downwardly.

Also depicted in the table in FIG. 4B is a list of the states of the R(2:0)ALU control signals, R(3) intermediate storage register control, R(4) output control signal, and DM CTRL data memory control signal that are transmitted by the control circuit 34 in response to each processing element representation which it may receive from symbol memory 12. The control circuit may be in the form of a read-only memory, which has a storage location for each type of circuit element that is addressed by the representation from the symbol memory. Each location in the read-only memory has field from which the control signals are generated in a known manner.

FIG. 4C depicts a memory map of the contents of the symbol memory 12 (FIG. 1) during the simulation of the network depicted in FIG. 4A. The letters correspond to the letters in the table in FIG. 4B and represent the processing elements located at corresponding locations in the network being simulated, which is depicted in FIG. 4A. The symbol memory is loaded by an operator prior to the beginning of a simulation.

FIG. 4D comprises a memory map of data memory 14. The A, B, and C (carry) input values are loaded into the data memory by an operator at the beginning of the simulation. The data in parentheses are loaded by the simulator 10 into the data memory during the simulation. The dashes in the memory map indicate locations in which no data is loaded during the simulation.

FIG. 4E-1 through 4E-3 detail the operations performed by the simulator during the successive steps or iterations during the simulation. The simulator begins the simulation at the input terminal in the upper left-hand corner having the location ($i=0$, $j=0$) and loads the contents of the data memory at the location into the intermediate storage register 38 (step 0). Specifically, the contents of the ($i=0$, $j=0$) location in data memory 14 are coupled to the A input terminal of ALU 36. In response to the signals from symbol memory 12 identifying the X input terminal element, the R(2:0) control signals from control circuit 34 enables the ALU to couple the signal at its A input terminal as the ALU OUT signal(see the table in FIG. 3). At the next CLK D signal, the R(3) control signal enables the ALU OUT signal to be latched in intermediate storage register 38. Thus, in response to the representation of the X input element in symbol memory 12, the simulator stores in the intermediate storage register 38 the data representative of the input signal which is applied to the network input at the corresponding input terminal of the network under simulation.

In the next several iterations, the simulator, and specifically the ALU 36, uses the contents of the intermediate storage register to generate the data corresponding to the downward output signals of the processing elements in row 0, columns 1, 2 and 3. The left output signals are all the same as the right input signals for these iterations. After it has generated each downward output signal, the simulator latches the signal in data memory 14 at the location having the corresponding column address, with the incremented row address. Since the output signals to the right in these three iterations are all the same as the input signals from the left, it is unnecessary for the simulator to change the contents of the intermediate storage register in the iterations.

Thus, in step 1, the simulator generates the downward output data for the "A" element at location ($i=1$, $j=0$; FIG. 4A). In response to the signals from the symbol memory 12 identifyning the "A" processing element, the control circuit enables the ALU 36 to couple the signal at its B input terminal as the ALU OUT signal. The signal at the B input terminal is the INT STO OUT signal representative of the contents of the intermediate storage register loaded in step 0. The control circuit 34 transmits the DM CTRL signal to enable, in response to the CLK D timing signal, the data memory 14 to latch the INT STO OUT signal at location ($i=1$, $j=1$). There is no change to the contents of the intermediate storage register. (This is depicted in step 1 on FIG. 4E-1).

In step 2, the simulator essentially repeats the operations in step 1 and determines the downward output value for the next "A" processing element located at ($i=2$, $j=0$) in the network (FIG. 4A), and deposits it into location ($i=2$, $j=1$) of the data memory.

In step 3, the simulator processes the "C" processing element at location ($i=3$, $j=0$) in the network (see FIGS. 4A and 4C). In response to the signals from the symbol memory 12, identifying the "C" processing element, the control circuit 34 enables the ALU to transmit the complement of the INT STO OUT signal at its B input terminal as the ALU OUT signal. The control circuit also transmits the DM CTRL signal which enables the ALU OUT signal to be latched by the data memory 14 in the ($i=3$, $j=1$) location.

In steps 4 through 7, the simulator 10 iteratively steps across the locations in row 0, columns 4 through 7. Since these are blank locations (contents of the data memory are "Z" in these locations), no operations are performed by ALU 36, and nothing is stored in data memory 14 or intermediate storage register 38. The output signal of the ALU in these steps corresponds to the signal at the B input terminal, which in turn corresponds to the contents of intermediate storage register 38.

Steps 8 through 15 detail the operations performed by the simulator in processing the elements in the second row of the array depicted in FIG. 4A. In step 8, like step 0, the input data deposited by the operator at the location in the data memory 14, which corresponds to the location in the symbol memory 12 which contains the representation of an "X" input element, is retrieved and stored in the intermediate storage register 38. Thus, in step 8 a "0" is latched in the intermediate storage register.

In step 9, the "B" processing element at location ($i=1$, $j=1$) is processed, which requires retrieval of the left and upper input data for the element. The upper input data is located in the ($i=1$, $j=1$) location in data memory 14, having been placed there in step 1. The left input data is contained in intermediate storage register 38. Since the right output value corresponds to the left input value, no change is made to the contents of intermediate storage register 38 in this step. The downward output value is stored in the ($i=1$, $j=2$) location in data memory 14, as shown in step 9 in FIG. 4E-1.

More specifically, in response to the signals from symbol memory 12 which identify the "B" processing element, the control circuit 34 transmits R(2:0) ALU control signals which enable the ALU to logically AND the signals at the A and B input terminals and transmit the result as the ALU OUT signals. The signal at the A input terminal corresponds to the data stored in the ($i=1$, $j=1$) location in data memory 14, which was stored there during step 1, and which comprises the upper input data for the B processing element. The signal at the ALU's B input terminal is the INT STO OUT signal from intermediate storage register 38, which comprises the left input data for the B processing element. The control circuit 34 also transmits the DM CTRL signal which enables the ALU OUT signal to be latched in the (i=1, j=2) location in data memory 14, to be used as the upper input data to the V element in that location in the network (FIGS. 4A, 4C) in step 17 (FIG. 4E-1). Since the B processing element couples the left input signal as the right output signal, the contents of the intermediate storage register are not changed in this step.

The "D" and second "B" processing elements in row 1 are processed in essentially the same way, in steps 10 and 11, as the "B" element was processed in step 9. Specifically, in each step, the left input data stored in the intermediate storage register is coupled to the B input terminal of ALU 36. The upper input data is retrieved from the corresponding location in data memory 14 and coupled to the A input terminal of the ALU. The ALU performs a logical operation under control of the R(2:0) ALU control signals from control circuit 34. The ALU OUT signal is then stored in the data memory in the same columns, in row 2, to provide the upper input signal to those processing elements in steps 18 and 19. Since the right output signal is the same as left input signal for both elements, no change is made to the contents of the intermediate storage register 38.

The simulator handles the blank elements ("Z") in the right four columns of row 1 in the same way as it handled the corresponding elements of the topmost row 0.

The operations performed by the simulator 10 in processing the elements located in row 2 of the network depicted in FIG. 4A are detailed in steps 16 through 23 on FIGS. 4E-1 and 4E-2. The blank element("Z") in the leftmost column (0) is handled the same way as the blank elements in rows 0 and 1 were handled. With reference to the vertical line at location (i=1, j=2), the simulator merely copies through ALU 36 the contents of the data memory location (i=1, j=2) into the data memory location (i=1, j=3), as shown in step 17.

In step 18, the element represented by the letter "E" causes the simulator to load the contents of the (i=2, j=2) location in data memory 14 into intermediate storage register 38 and, in step 19, the "F" element at (i=3, j=2) causes the control circuit 34 to enable the ALU 36 to perform a logical OR operation on the contents of the (i=3, j=2) location in data memory 14 and the contents of intermediate storage register 38. The operations performed by simulator 10 in steps 20 through 23 correspond to the operations depicted in steps 1 through 3 on FIG. 4E-1.

Specifically, in step 18, when the symbol memory transmits signals identifying the "E" processing element, the control circuit transmits R(2:0) ALU control signals which enable the ALU 36 to transmit the signal at its A input terminal as the ALU OUT signal. The signal at the A input terminal corresponds to the contents of the (i=2, j=2) location in the data memory 14, which were stored in step 10 as the upper input data for the "E" processing element. The control circuit also transmits the R(3) intermediate storage register control signal to enable the intermediate storage register 38 to latch the ALU OUT signal, in response to the CLK D timing signal. The control circuit 34 negates the DM CTRL data memory write control signal during this step and so the ALU OUT signal is not latched by the data memory during this step.

In step 19, when the symbol memory transmits signals identifying the "F" processing element, the control circuit 34 transmits R(2:0) ALU control signals which enable the ALU 36 to transmit the OR of the signals at its A and B input terminals as the ALU OUT signal. The signal at the A input terminal corresponds to the contents of the (i=3, j=2) location in data memory 14, which were stored in step 11 as the upper input data for the "F" processing element. The signal at the B input terminal is the INT STO OUT signal, which corresponds to the contents of the intermediate storage register. These contents correspond to the left input data for the "F" processing element, having been stored in the register 38 in step 18. Since the "F" processing element has no downward output, the control circuit negates the DM CTRL data memory write control signal so that no data will be written in the data memory. The "F" processing element has an output to the right, and so the control circuit asserts the R(3) control signal to enable the intermediate storage register 38 to latch the ALU OUT signal in response to the next CLK D timing signal.

The operations performed by simulator 10 in steps 24 through 47 (FIGS. 4E-2 and 4E-3) will be readily apparent to those skilled in the art from the above explanation, and will not be described here in detail. The S sum output signal is transmitted to the operator in step 39, when the simulator processes the Y output terminal element located at location (i=7, j=4) and the C' carry output signal is transmitted at step 47 when the simulator processes the Y element at location (i=7, j=5). When the simulator processes both Y elements, the control circuit 34 transmits the R(4) read control signal, which is coupled through AND gate 42 as a READ signal in response to the CLK D signal. The network output signal corresponds to the contents of the intermediate storage locations in those steps. Specifically, the S output signal is a "1" and C' carry output signal is a "0", which is the expected values with A, B and C carry input signals of "1", "0," and "1" respectively.

From the foregoing example (FIGS. 4A through 4E-B) it is apparent that the ALU OUT signal from ALU 36 is not latched in both data memory 14 and intermediate storage register in the same step in simulator 10. It will be appreciated, however, that some processing elements, other than those used in connection with the foregoing example, may require that an ALU OUT signal be latched in both data memory 14 and register 38 in the same step. This can be accomplished by modifying simulator 10 in a number of ways. First, instead of having one timing signal, here CLK D, control both the data memory and register 38, these elements can be controlled by two successive timing signals. In that case, the ALU 36 may also be controlled by appropriate timing signals, particularly if the output signals differ. The ALU control signals from control circuit 34 must identify the logical operations to be performed to successively obtain the two output signals.

Alternatively, the data memory 14 and register 38 can be controlled by the same timing signal if the ALU is divided into separate logical units, both controlled by the control circuit 34, and both having the same input signals from the data memory and the intermediate storage register. The output signal from one ALU logical unit would then be coupled to the data input terminal of the data memory 14, and the output signal from the other ALU logical unit would be coupled to the data input terminal of register 38.

The foregoing description has been limited to a specific embodiment of this invention. It will be apparent, however, that the invention can be practiced in simulations having diverse basic construction than is disclosed in this specification with the attainment of some or all of the advantages of the invention. It will also be appreciated that the invention can be practiced in a suitably programmed general purpose computer system, the programming for which would be readily apparent to those skilled in the art. Therefore, it is the object of the appended claims to cover all such variations and modifications as come within the true spirit and scope of the invention.

What is claimed as new and desired to be secured by Letters Patent of the United States is:

1. Apparatus for simulating a network of processing elements arranged in an array pattern, the processing elements comprising the network being of predetermined types each having selected characteristics and being identified by a unique representation, said apparatus comprising:
   a. memory means comprising:
      (i) network storage means having a plurality of storage locations arranged in an array pattern corresponding to the array pattern of the network, each storage location storing representation of the processing elements in the network at the corresponding locations in the network;
      (ii) data storage means for storing process data;
   b. address computation means connected to said memory means for computing an address for transmission to said memory means to identify corresponding storage locations in both said network storage means and said data storage means;
   c. processing means connected to said data storage means for receiving process data from said data storage means and processing the received process data to generate new process data;
   d. control means connected to said network storage means, said data storage means and said processing means for receiving the representations from said network storage means and generating control signals to control said processing means in the processing of process data from said data storage means and the storage of process data in said storage means; and
   e. timing means connected to said memory means, said address computations means and said control means for iteratively generating a sequence of timing signals for timing the operations of said memory means, said address computation means and said control means.

2. Apparatus as defined in claim 1 wherein said control means comprises read only memory means having a plurality of locations each corresponding to one of said network element representations, each location storing a control word correponding to the control signals transmitted by said control means in response to the representations.

3. Apparatus as defined in claim 1 wherein said processing means comprises arithmetic and logic means having a first data input terminal connected to said data storage means, a second data input terminal and a control input terminal connected to said control means for performing arithmetic and logical operations on the data at said first and second data input terminal and couple the results to a data output terminal.

4. Apparatus as defined in claim 3 wherein one of the network elements comprises a network output element and the output terminal of said intermediate data storage means also comprises the output terminal of said apparatus, said control means including means for generating an output enabling signal in response to the receipt from said symbol memory of the representation of the network output element.

5. Apparatus as defined in claim 1 wherein said data storage means comprises process data storage means connected to said address computation means, said processing means and said control means and having a plurality of storage locations having addresses arranged in a row and column array pattern corresponding to the array pattern of the network, for storing the output signal from said processing means in response to a control signal from said control means, and an intermediate storage register connected to said control means and said processing means for storing the output signal from said processing means in response to a control signal from said control means.

6. Apparatus as defined in claim 5 in which a network element has inputs from the left and above in the array and outputs to the right or down in the array, said address computation means including means for transmitting an incremented row address to said process data storage means, said control means transmitting a control signal to said process data storage means enabling it to store the output of the processing means when the output corresponds to the down output of the network element in the row identified by the incremented row address.

7. Apparatus as defined in claim 6 in which the control means includes means for enabling the intermediate storage register to store the output of the processing means when the network element output corresponds to the right output of the network element.

8. Apparatus as defined in claim 1 wherein said address computation means comprises:
   a. column address means connected to said timing means for generating a column address in response to the receipt of a timing signal;
   b. row address means for generating a row address; and
   c. reset means connected to said column address means and said row address means for resetting said column address means and enabling said row address means to increment when said column address means has reached a selected value.

9. Apparatus as defined in claim 8 wherein said column address means and said row address means both comprise counters, said column address counter being enabled to increment by said timing signal and said row address counter being enabled to increment by said reset means.

10. Apparatus as defined in claim 9 wherein said reset means comprises register means for storing the selected value and comparator means connected to the output of said column address counter and to said register means for generating a signal when the output of said column address counter equals the value stored in said register means, said signal being coupled to reset said column address counter and to enable said row address counter to increment.

11. Apparatus as defined in claim 10 wherein said reset means further includes second register means for storing a second selected value and second comparator means connected to said second register means and said row address counter, said second comparator means generating a signal when the output of said row address counter equals the second selected value stored in said second register means for enabling said row address counter to reset.

12. Apparatus as defined in claim 8 wherein said address computation means further comprises:
- a. incrementation means connected to said row address means for generating an incremented row address; and
- b. multiplexer means connected to said row address means, said incrementation means, and said timing means and said data memory means for coupling the output of said row address means or said incrementation means in response to the condition of one of said sequence of timing signals, the output of said row address means controlling the location from which the contents of said data memory means is read and the output of said incrementation means controlling the location into which the output of said processing means is written.

* * * * *